United States Patent
Iwasaki

[19]

[11] Patent Number: 6,034,436
[45] Date of Patent: Mar. 7, 2000

[54] SEMICONDUCTOR DEVICE HAVING AN IMPROVED THROUGH-HOLE STRUCTURE

[75] Inventor: Ritsuko Iwasaki, Kanagawa, Japan

[73] Assignee: NEC Corporation, Tokyo, Japan

[21] Appl. No.: 08/980,281

[22] Filed: Nov. 28, 1997

[30] Foreign Application Priority Data

Nov. 28, 1996 [JP] Japan ................................. 8-317589

[51] Int. Cl.[7] ................................................ H01L 23/48
[52] U.S. Cl. ........................ 257/774; 257/758; 257/776
[58] Field of Search ................................. 257/758, 774, 257/776

[56] References Cited

U.S. PATENT DOCUMENTS

| | | | |
|---|---|---|---|
| 3,323,198 | 6/1967 | Shortes | 257/758 |
| 5,034,799 | 7/1991 | Tomita et al. | 257/758 |
| 5,204,286 | 4/1993 | Doan | 437/195 |
| 5,264,729 | 11/1993 | Rostoker et al. | 257/774 |
| 5,442,236 | 8/1995 | Fukazawa | 257/758 |
| 5,710,462 | 1/1998 | Mizushima | 257/758 |
| 5,723,883 | 3/1998 | Gheewalla | 257/204 |
| 5,742,099 | 4/1998 | Debnath et al. | 257/758 |
| 5,744,865 | 4/1998 | Jeng et al. | 257/750 |
| 5,760,429 | 6/1998 | Yano et al. | 257/211 |

FOREIGN PATENT DOCUMENTS

| | | |
|---|---|---|
| 3-231429 | 10/1991 | Japan . |
| 6-93048 | 3/1992 | Japan . |
| 6151456 | 5/1994 | Japan . |
| 6-350055 | 12/1994 | Japan . |
| 8167609 | 6/1996 | Japan . |
| 8204002 | 8/1996 | Japan . |

*Primary Examiner*—Teresa M. Arroyo
*Attorney, Agent, or Firm*—Sughrue, Mion, Zinn Macpeak & Seas, PLLC

[57] ABSTRACT

A semiconductor device has isolated first layer interconnects, second layer interconnects, third layer interconnects, and through-holes each connecting one of the second layer interconnects and a corresponding one of the third layer interconnects together. The through-holes extend beyond the sides of the second layer interconnects to reach the isolated first layer interconnects and rest thereon. The through-holes are formed by a single etching step using a common glass pattern. The occupied area for the interconnects and the fabrication steps thereof can be reduced.

5 Claims, 9 Drawing Sheets

SEMICONDUCTOR DEVICE HAVING AN IMPROVED THROUGH-HOLE STRUCTURE

BACKGROUND OF THE INVENTION (a) Field of the Invention

The present invention relates to a semiconductor device having an improved through-hole structure, and in particular, to a semiconductor device having an improved through-hole structure in a multi-layer interconnection structure.

(b) Description of the Related Art

A general construction of a conventional semiconductor device having a multi-layer interconnect structure is shown in FIGS. 1A and 1B, which illustrate a through-hole (via) structure connecting two interconnection layers formed by different steps. FIG. 1A illustrates a first layer interconnects A11, A12 and A13 made of aluminum or aluminum alloy, a second layer interconnects A21, A22 and A23 made of aluminum or aluminum alloy, which correspond to the respective underlying first layer interconnects A11, A12 and A13, and through-holes T11, T12 and T13 which connect corresponding interconnects together in both the layers. In the region where the overlying second layer interconnect A23, for example, and the underlying first layer interconnect A13 are connected together by the through-hole T13, margins "d" and "a" are required of the through-hole T13 on a mask pattern with respect to both the second layer interconnect A23 and the first layer interconnect A13. These margins are provided to prevent the through-hole T13 from offsetting or protruding outside the first and second layer interconnects A13 and A23 due to an error or variation in a photolithographic etching process.

FIGS. 2A and 2B show a top plan view of the contact regions of FIG. 1A and a cross sectional view taken along line X–X' in FIG. 2A, respectively. In the fabrication step of the conventional device, an insulating laminate B1 including a plurality of oxide films is formed by iterative depositing steps on a silicon substrate Jk. First layer interconnects A11, A12 and A13 and second layer interconnects A21, A22 and A23 are formed between the depositions of the oxide films and disposed in correspondence to the through-holes T11, T12 and T13, respectively. It will be noted that the first layer interconnect A13, for example, is coupled to the overlying second layer interconnect A23 with the margin "a" with respect to the location of the through-hole T13 at both edges of the interconnect A13. In this respect, there is also disposed the margin "d" for the overlying second layer interconnect A23 with respect to the location of the through-hole T13.

In FIG. 2A, the space or gap between the adjacent two of the first layer interconnects A11, A12 and A13 is denoted by "b" and the space between the adjacent two of the second layer interconnects A21, A22 and A23 is denoted by "n". A first total width "W", which represents the total width necessary for arranging the first layer interconnects A11, A12 and A13, is expressed as follows:

$$W=3\times(2a+i)+2b=6a+3i+2b,$$

wherein "i" represents the width of each through-hole.

A second total width Wa2, which represents the total width necessary for arranging the second layer interconnects A21, A22 and A23, is similarly expressed as follows:

$$Wa2=3\times(2d+i)+2n=6d+3i+2n.$$

FIGS. 3A and 3B shows, similarly to FIGS. 2A and 2B, another interconnect structure having buried contacts. The illustrated structure is different from the structure of FIGS. 2A and 2B in that overlying second layer interconnects (not shown) is formed after the deposition of the buried through-holes A11, A12 and A13. In this structure, the total width of the space for arranging the interconnects A21, A22 and A23 are 6a+3i+2b, which is substantially same as the semiconductor device of FIGS. 2A and 2B.

In order to reduce the space for disposing the interconnects, an arrangement shown in FIG. 1B may be employed in place of FIG. 1A in consideration of the above facts. Specifically, in FIG. 1B, three through-holes T11, T12 and T13 similar to those shown in FIG. 1A are disposed so that each adjacent two of the through-holes are offset from each other in the longitudinal direction of the interconnects for reduction of the total width of the interconnects By this configuration, it is possible to reduce the total width "W" shown in FIG. 1A by the margin "a" to obtain a reduced width which is equal to "W−a". However, in this configuration, the longitudinal length "V" of the first layer interconnects A11, A12 and A13 is increased by β at the location of the through-holes T11, T12 and T13 to thereby result in the length "V+β" of the space for disposing the through-holes T11, T12 and T13, as shown in FIG. 1B. As a consequence, while the total width "W" can be reduced in the transverse direction, the length "V" increases in the longitudinal direction of the interconnects.

Further, if the pattern illustrated in FIG. 1B is repeated for a large number of the interconnects, the increase of the longitudinal length by β has a more significant effect upon the area of the mask pattern. A repetition of such an identical pattern is notable in a semiconductor chip having memory cells, for example, and especially in the memory cell array area and in the peripheral circuit area disposed in the vicinity of the memory cell array area. It will be noted that the peripheral circuit area is directly connected with memory cells, and accordingly, a large number of peripheral circuit areas equal in number to the columns or rows of the memory cells are located adjacent to the memory cell array area.

FIG. 4 is a schematic top plan view of a conventional semiconductor memory device. A peripheral circuit area AR is disposed for peripheral circuit blocks, which are disposed at the same pitch as the row or column of the memory cells in the memory cell array area. The peripheral circuit area AR for a 1-megabit memory device, for example, includes a column circuit area RK having digit lines and sense amplifiers and a row circuit area KK having word lines and row decoders, each circuit area including 256 to 2048 circuit blocks or more in number. If the total width "W" which is equal to 6a+3i+2b for the first layer interconnects in FIG. 1A is applied to the column circuit blocks in FIG. 4, it will be noted that the width CW required for disposing the column circuit blocks will amount to approximately W×(256 to 2048), which significantly increases the chip size of the memory device.

If the arrangement illustrated in FIG. 1B is applied to the memory device of FIG. 4 for reduction of the required chip size CW by an amount corresponding to a×(256 to 2048), there results an increase in the area corresponding to β×L×2, wherein L is the length of the side of the chip. In other words, it may be concluded that a reduction in the chip size of the semiconductor memory device is not achieved.

The same applies to the case where the arrangement shown in FIG. 1A is used for the row circuit blocks. The required size CW' is approximately equal to W×(256 to 2048). If the arrangement shown in FIG. 1B is employed, although a reduction by an amount corresponding to a×(256 to 2048) is possible, an increase in the chip area results, which corresponds to β×L×2. It is to be noted that since the peripheral circuit area AR contains a mask pattern having a very small size, the desired circuit can be obtained substantially solely by a multilayer interconnection structure and corresponding through-holes. That is, the number of through-holes is significantly larger in the peripheral circuit area than in the memory cell array area. Currently, the contact areas occupy on the order of about 30% of the peripheral circuit area AR, and this represents one of the factors which increase the occupied area of the semiconductor memory device.

FIGS. 5A and 5B show cross sections of semiconductor devices described in Patent Publications JP-A-4(1992)-93048 and JP-A-3(1991)-231429, respectively, each having a multi-layer interconnection structure. In these semiconductor devices, a conductive material "D" such as tungsten is used in through-holes JT1 for connecting multilayer interconnects including silicon substrate Ja1, a first layer interconnect Ja2, a second layer interconnect Ja3, and a third layer interconnect Ja4, the through-holes being formed by a single photolithographic etching step using a common glass mask. FIG. 5A shows that interconnects in the respective layers Ja1 to Ja4 are collectively connected together by the through-holes, and FIG. 5B shows that interconnects in various layers except for the silicon substrate Ja1 are collectively connected together by the through-holes.

When these techniques are employed to define through-holes in a semiconductor device having a multi-layer interconnection structure, an advantage is attained that the number of steps, manpower and costs can be reduced by using a single glass mask for patterning the through-holes, in contrast to a large number of glass masks for patterning an interconnection structure in the conventional semiconductor device, especially when the design for the semiconductor device is changed or improved.

It will be noted that the margin required for the through-holes JT1 connecting the first layer interconnects Ja2 and the second layer interconnects Ja3 is similar to that illustrated in FIGS. 1A, 1B and 2, which means that reduction of the semiconductor chip size is not attained by these techniques.

Patent Publication No. JP-A-6(1994)-350055 describes a through-hole structure for reducing the number of steps, as shown in FIG. 6. The described technique is applied to memory cells in a SRAM having a high-resistance load resistor. Specifically, a drain electrode Jb2 of a first driver transistor, a gate electrode Jb3 of a second driver transistor, and a terminal of high-resistance load resistor Jb4 are collectively connected to a through-hole Jb7, which is provided for the contact for the drain Jb2 of the first driver transistor. This structure allows a single etching step to form the contact between a plurality of layers, thereby reducing the number of fabrication steps, period and the costs. However, this technique only applies to a SRAM memory cell having a high-resistance load resistor. Besides, while this technique is applied to a multi-layer interconnection structure, a margin is required of the contact Jb7 relative to the N+drain electrode Jb2, or first layer interconnect, and hence a reduced pattern area cannot be obtained. In addition, since the through-hole Jb5 is connected to the drain electrode Jb2, there results a forward-biased current flowing from P-type substrate Jb1 through the drain electrode Jb2 to the aluminum interconnect Jb6 if a potential below the potential of the P-type substrate Jb1 occurs on the aluminum interconnect Jb6. Moreover, since the drain electrode Jb2 involves a parasitic capacitance significantly greater than the capacitance of the interconnects, a high speed operation cannot be obtained in the memory device.

While the techniques in the prior art have been discussed above, any of them requires a margin for the through-hole to assure the electric contact between the overlying layer interconnects and the underlying layer interconnects, although these techniques achieve a reduction in number of steps or prevention of a penetration failure involved in the through-hole. That is, these techniques do not achieve a reduction of masked area in the semiconductor device without reduction of the contact area between interconnect layers.

SUMMARY OF THE INVENTION

It is an object of the present invention to provide a semiconductor device which maintains an equal or greater area for a contact area as obtained in the prior art while enabling a reduction in an occupied area relative to the chip size of the semiconductor device.

In accordance with the present invention, there is provided a semiconductor device comprising a substrate, a first layer interconnect overlying the substrate, a second layer interconnect overlying the first layer interconnect, a third layer interconnect overlying the second layer interconnect, and a through-hole filled with a conductive material and extending between and contacting the first layer interconnect and third layer interconnect while passing the second layer interconnect, the conductive material being in contact with the second layer interconnect at a top surface and at least one side surface of the second layer interconnect.

In a preferred embodiment, the through-hole has a width larger than the width of the second layer interconnect, or the center of the through-hole is offset from the center of the second layer interconnect to pass by the second layer interconnect.

The first layer interconnect is preferably isolated from other interconnects except for the through-hole. The second layer interconnect may have an offset edge in alignment with the through-hole.

In accordance with the semiconductor device of the present invention, an occupied area of the semiconductor device and the number of fabrication steps can be reduced by forming in a single step a plurality of through-holes, extending between the first layer interconnects and the third layer interconnects passing the second layer interconnects.

The above and other objects, features and advantages of the present invention will be more apparent from the following description, referring to the accompanying drawings.

DESCRIPTION OF THE PREFERRED EMBODIMENTS

Figure 1A:
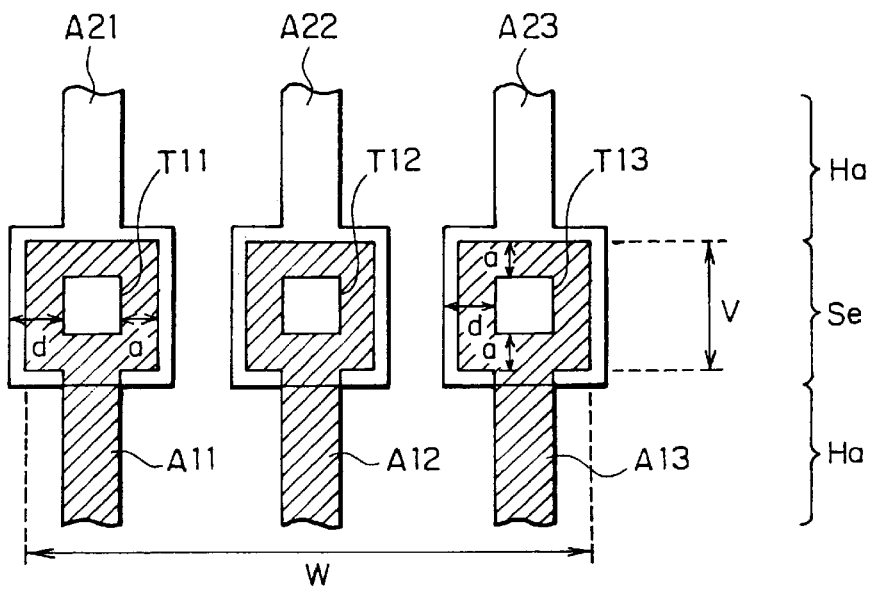
FIGS. 1A and 1B are top plan views of a conventional multilayer interconnection structure and a variation thereof, respectively.
Figure 1B:
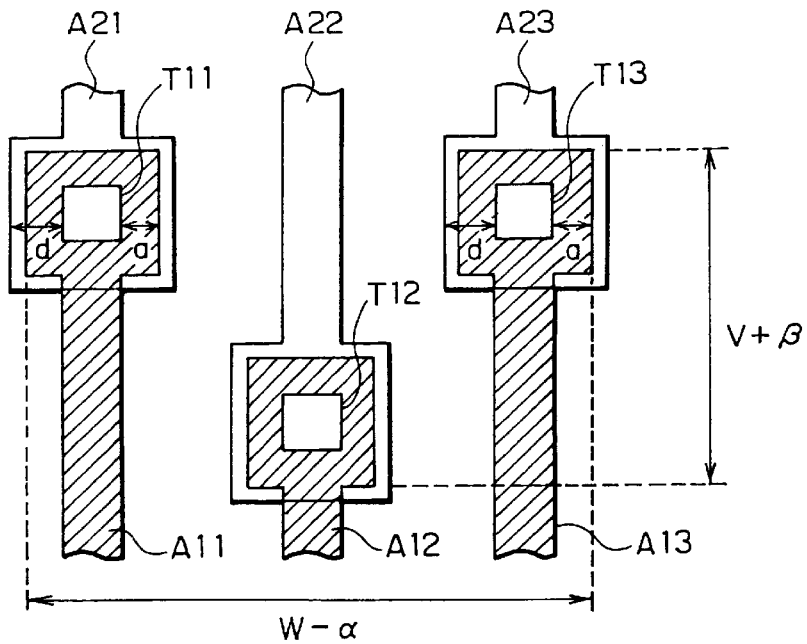

Now, the present invention is more specifically described with reference to accompanying drawings, wherein similar constituent elements are designated by the same or similar reference numerals.

Figure 7A:
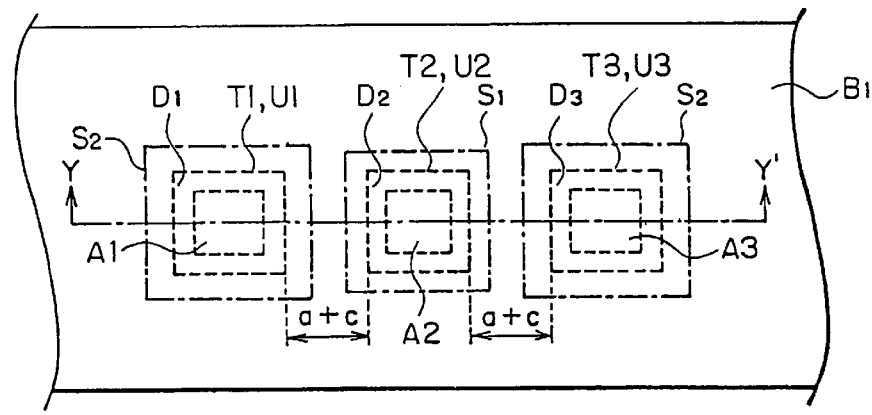
FIG. 7A is a schematic top plan view of a multilayer interconnection structure in a semiconductor device according to a first embodiment of the present invention.
Figure 7B:
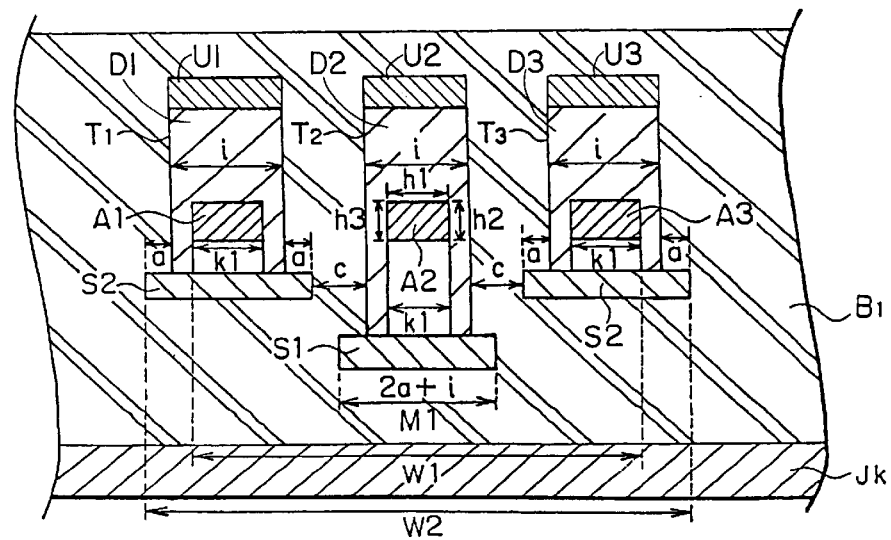
FIG. 7B is a cross-sectional view taken along line Y–Y' in FIG. 7A.

Referring to FIGS. 7A and 7B, a semiconductor device according to a first embodiment of the present invention has a silicon substrate Jk, an insulating laminate B1 including a plurality of oxide films formed on the silicon substrate Jk, a first layer underlying interconnect S1 made of a silicide overlying the silicon substrate Jk while insulated therefrom by the oxide film, second layer underlying interconnects S2 and S2, third layer interconnects A1, A2 and A3 overlying the respective underlying interconnects S1, S2 and 53, and through-holes T1, T2 and T3 filled with a conductive material, such as tungsten, designated by D1, D2 and D3 for connecting the third layer interconnects A1, A2 and A3 with overlying fourth layer interconnects U1, U2, and U3 formed on the top of the through-holes.

The first and second layer underlying interconnects S1, S2 and S2 are formed solely in order for underlying the through-holes T2, T1 and T3 during the step of forming functional interconnects of first conductive layer and second conductive layer, and hence, not connected to any of interconnects except for the through-holes. The third layer interconnects A1, A2 and A3 are ordinary ones and are to be connected with overlying fourth layer interconnects U1, U2, and U3 overlying the through-holes.

The width k1 of the third layer interconnects A1, A2 and A3 is less than the width "i" of the through-holes T1, T2 and T3, and the centers of the third layer interconnects A1, A2 and A3 are disposed at the centers of the respective through-holes T1, T2 and T3, in the widthwise direction of the interconnects A1, A2 and A3. The conductive material D1, D2 and D3 filling the through-holes T1, T2 and T3 for connection of the third layer interconnects A1, A2 and A3 with the overlying interconnects U1, U2, and U3 is of a buried structure embedded in the oxide laminate B1. In this configuration, a margin for the through holes T1, T2 and T3 with respect to the third layer interconnects A1, A2 and A3 are not necessary. During an etching step to form the through-holes T1, T2 and T3, the underlying interconnects S1, S2 and S2 have a function for prevention of penetration by the through-holes toward the bottom of the device. It is to be noted that the through-holes T1, T2 and T3 are formed by a single step using a common mask pattern, although the first layer underlying interconnects S1 is formed by a step effected before the step for formation of the second layer underlying interconnects S2 and S2.

Figure 8:
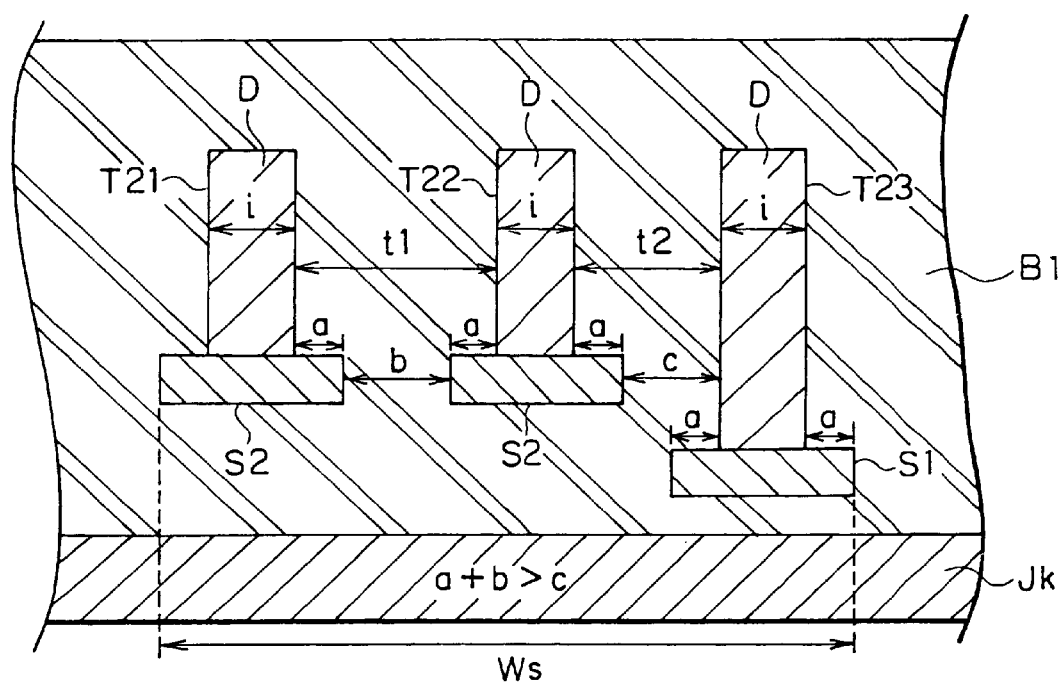
FIG. 8 is a schematic cross-sectional view of an exemplified multilayer interconnection structure in a semiconductor device according to the present invention, for explanation of the dimensions of the through-hole structure.

FIG. 8 shows an exemplified multilayer interconnection structure according to the present invention, which is similar to FIG. 7B, although the arrangement of the underlying interconnects S1, S2 and S2 are different from that of FIG. 7B. In FIG. 8, the structure is simplified by extracting the conductive materials "D" in the through-holes T21, T22 and T23 and the underlying interconnects S1, S2 and S2.

Assuming that the margin "a" is required between locations of the walls of the through-holes T21, T22 and T23 and the respective edges of the underlying interconnects 52, 52 and S1, that "b" is the spacing between the adjacent second layer underlying interconnects S2 and S2, and that "c" is the spacing between the underlying interconnect S2 and through-hole T23, the gap t1 between the adjacent through-holes T21 and T22 and the gap t2 between the adjacent through-holes T22 and T23 are represented as follows:

$t1=2a+b$ and $t2=a+c$.

Here, "b" and "c" may be considered equivalent to each other, and "c" need not include the margin "a", which means $t1>t2$.

Figure 2A:
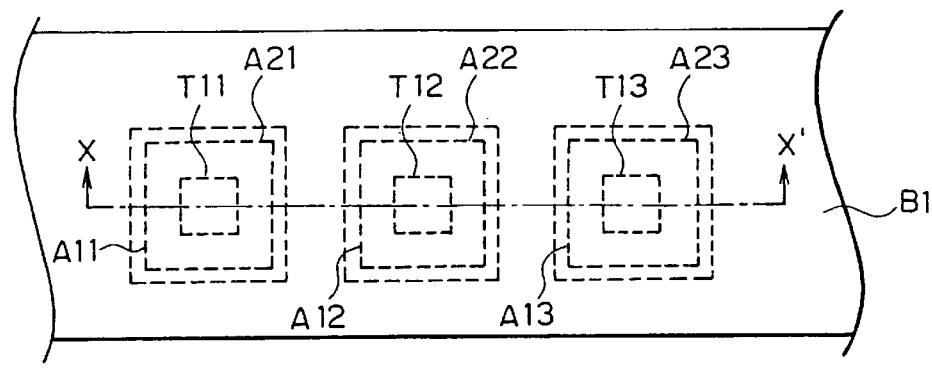
FIGS. 2A and 2B are a detailed top plan view and a cross-sectional view, respectively, of the multilayer interconnection structure.
Figure 2B:
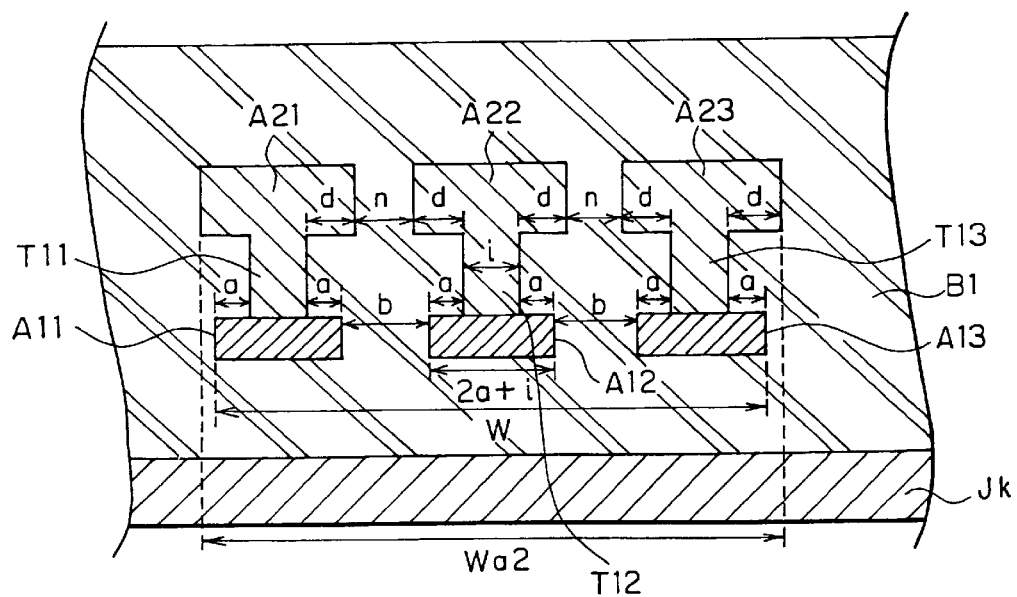
Figure 3A:
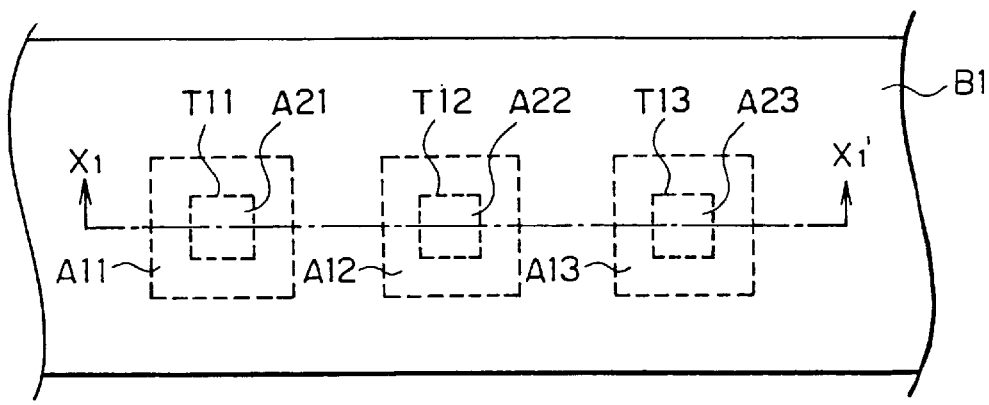
FIGS. 3A and 3B are a top plan view and a cross-sectional view of another conventional multilayer interconnection structure.
Figure 3B:
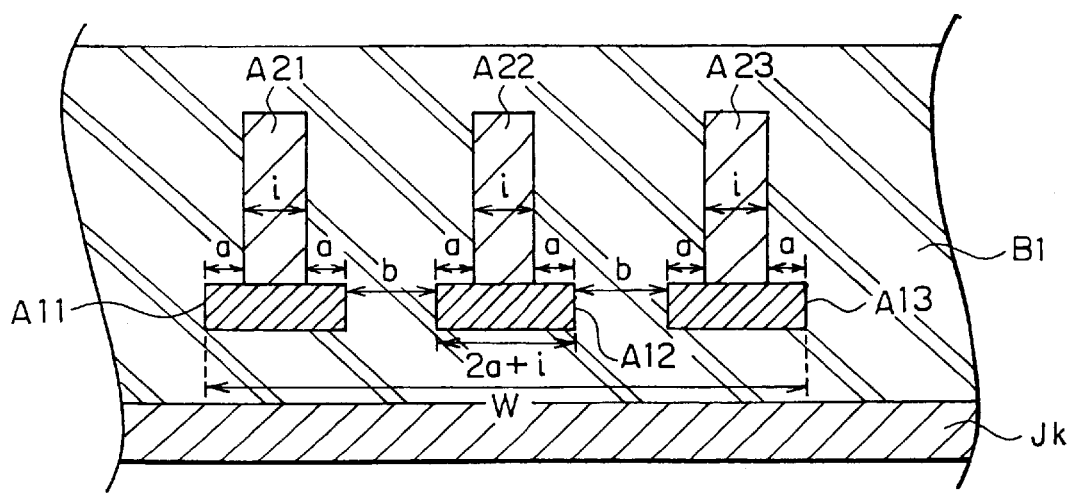
Figure 4:
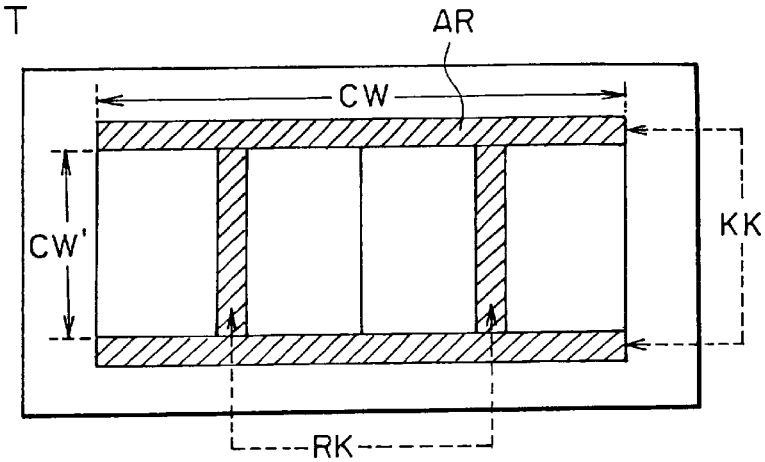
FIG. 4 is a schematic top plan view of a conventional semiconductor memory device.
Figure 5A:
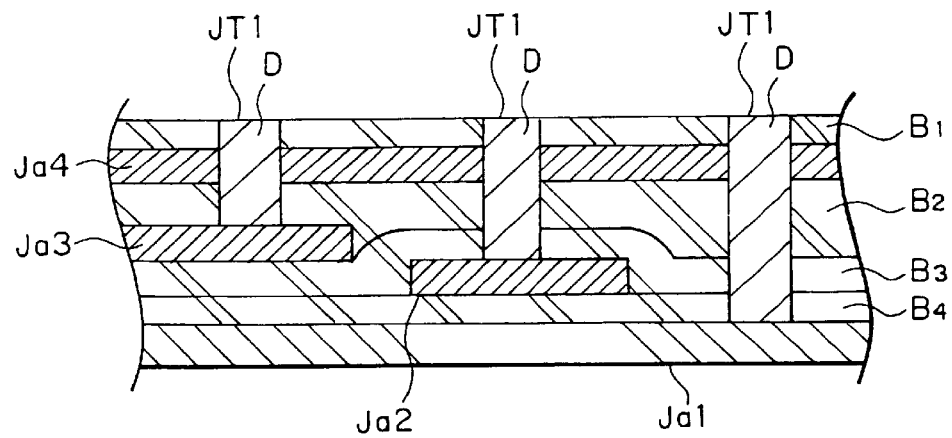
FIGS. 5A and 5B are a cross-sectional views of other conventional multilayer interconnection structures.
Figure 5B:
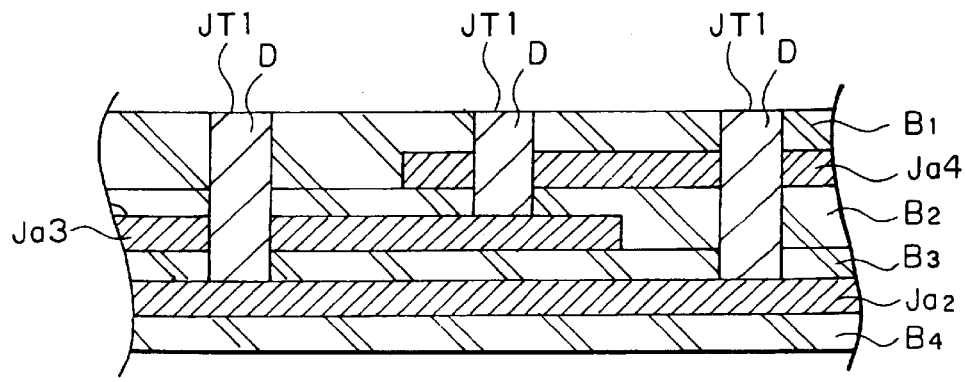
Figure 6:
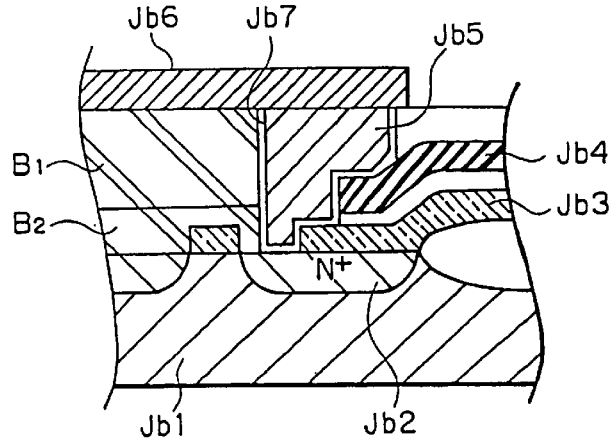
FIG. 6 is a cross-sectional view of a conventional memory cell having a high-resistance load resistor.

Specifically, by using the different layers for the adjacent underlying interconnects for underlying the through-holes to be formed by a single step, the gap between the through-holes can be reduced compared to the case of using the same layer for the underlying interconnects. The total width Ws necessary for arranging the underlying interconnects S1, S2 and S2 can be expressed as follows:

$Ws=5a+3i+2b$, which is smaller as compared to the total width W ($W=6a+3i+2b$) of the underlying interconnects in the prior art of FIG. 2B.

In FIG. 7B, a sufficient margin "a" is assured between the through-holes T1, T2 and T3 and corresponding underlying interconnects S2, S1 and S2, which means that penetration by the through-holes is prevented by the inventive structure. The underlying interconnects S1, S2 and S2 can be formed by conventional steps such as formation of a silicide interconnect layer or a gate polysilicon layer. A large contact area of the third layer interconnect A2, for example, with respect to the conductive material D2 in the through-hole T2 is also secured by disposing both the side surfaces h2 and h3 as well as the top surface h1 of the interconnect A2 in contact with the conductive material D2. The large contact area does not increase the occupied area itself for the semiconductor device.

Figure 9A:
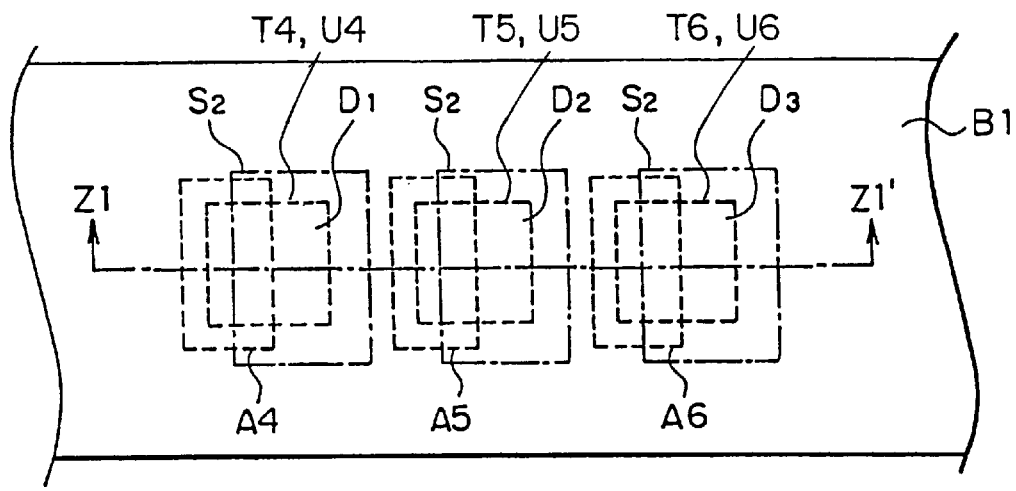
FIGS. 9A and 9B are a schematic top plan view and a cross-sectional view, respectively, of an interconnection structure in a semiconductor device according to a second embodiment of the present invention.
Figure 9B:
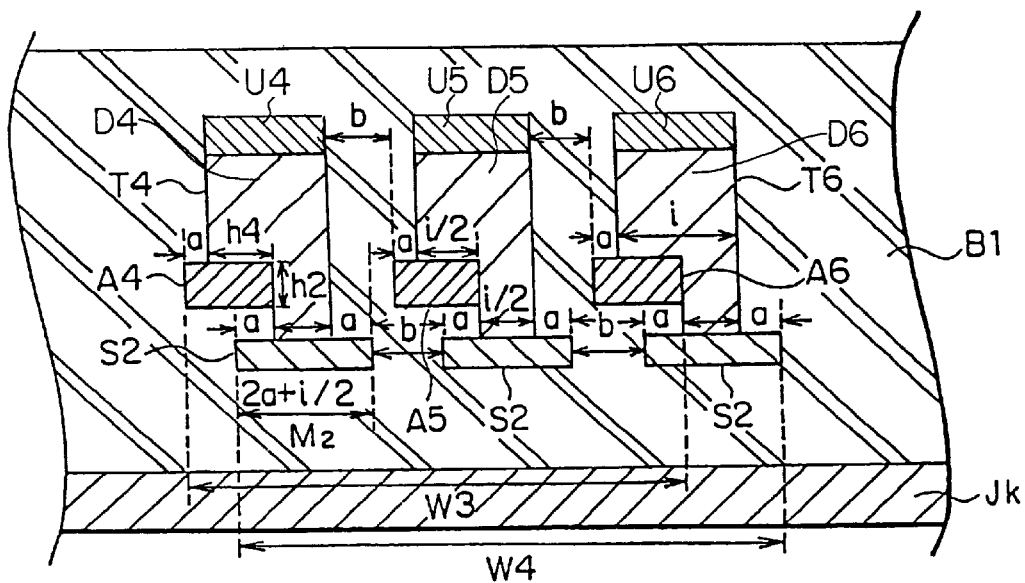

Referring to FIGS. 9A and 9B, a semiconductor device according to a second embodiment of the present invention is similar to the first embodiment except for the arrangement of the interconnects A4, A5 and A6 with respect to the respective through-holes T4, T5 and T6 and the layer structure of the underlying interconnects S2. Specifically, the interconnect A4, for example, is formed as a second layer interconnect not located at the center of the through-hole T4, and the one of the edges of the interconnects A4 is located at the center or in the vicinity of the center of the through-hole T4 as viewed in the widthwise direction of the interconnect A4. One of the edges of the lower portion of the through-hole T4 is defined by the one of the edges of the interconnect A4, and thus, the through-hole has a bottom area which is substantially half the top area of the through-hole T4. The bottoms of the through-holes T4, T5 and T6 rest on and supported by the respective underlying interconnects S2, S2 and S2, which are formed as a first layer interconnect. The width M2 of the underlying interconnect S2 is expressed as follows:

$$M2=2a+i/2,$$

which is smaller than the width M1=2a+i in the first embodiment. The smaller width of the underlying interconnects enables to use a single layer of the underlying interconnects.

The contact area for the first layer interconnect A4 with respect to the conductive material D1 corresponds to the length h4+h2 which is smaller than the contact area in the first embodiment corresponding to the length h1+h2+h3, wherein h4<h1. However, the contact area in the present embodiment may be comparable to or larger than the contact area in the conventional device, because of the contact area using the side surface h2 of the interconnect.

Figure 10A:
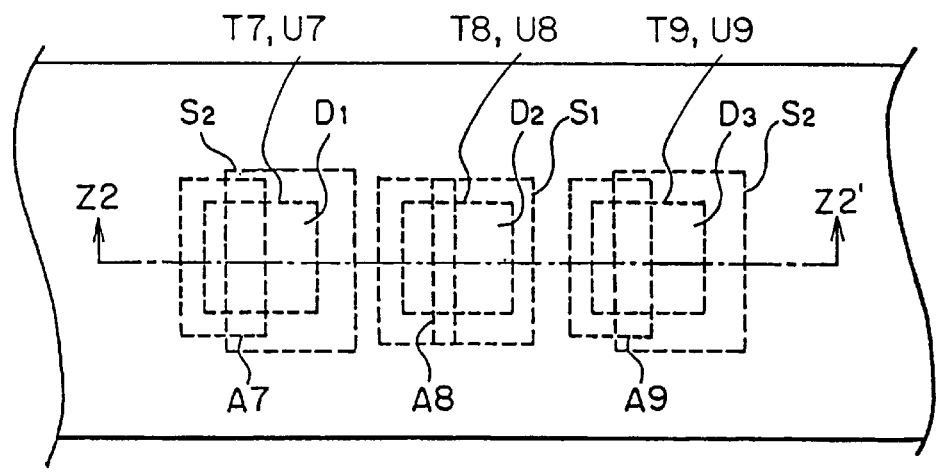
FIGS. 10A and 10B a schematic top plan view and a cross-sectional view, respectively, of an interconnection structure in a semiconductor device according to a third embodiment of the present invention.
Figure 10B:
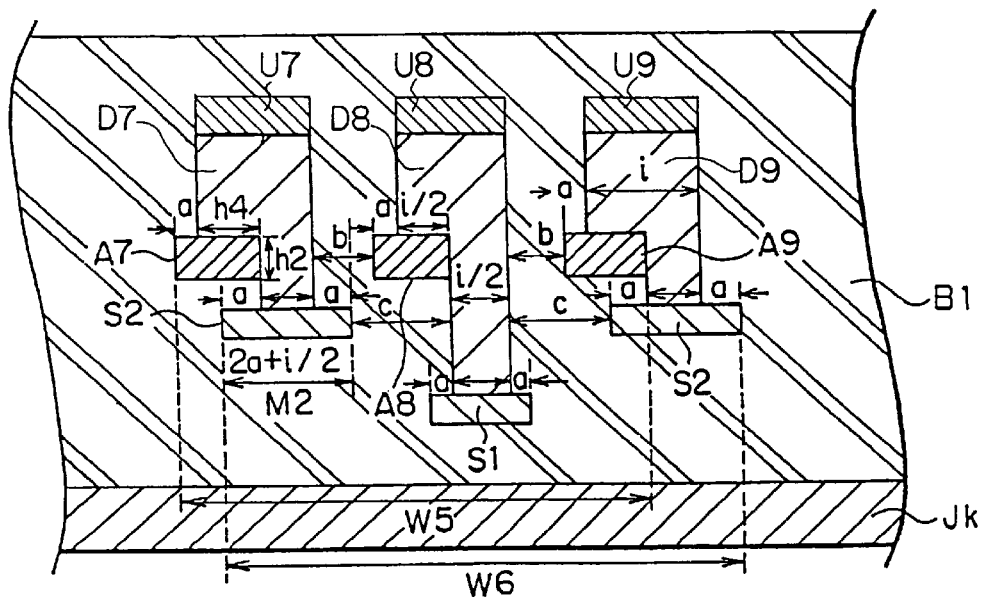

Referring to FIGS. 10A and 10B, a semiconductor device according to a third embodiment of the present embodiment is similar to the second embodiment except for the underlying interconnects S1, S2 and S2 which are formed from two different layers. The width M2 of the underlying interconnects is expressed as M2=2a+i/2 similarly to the second embodiment. The different layers for the underlying interconnects reduces the total width W6 of the underlying interconnects S1, S2 and S2. The contact area of the present embodiment is also similar to the second embodiment.

Figure 11:
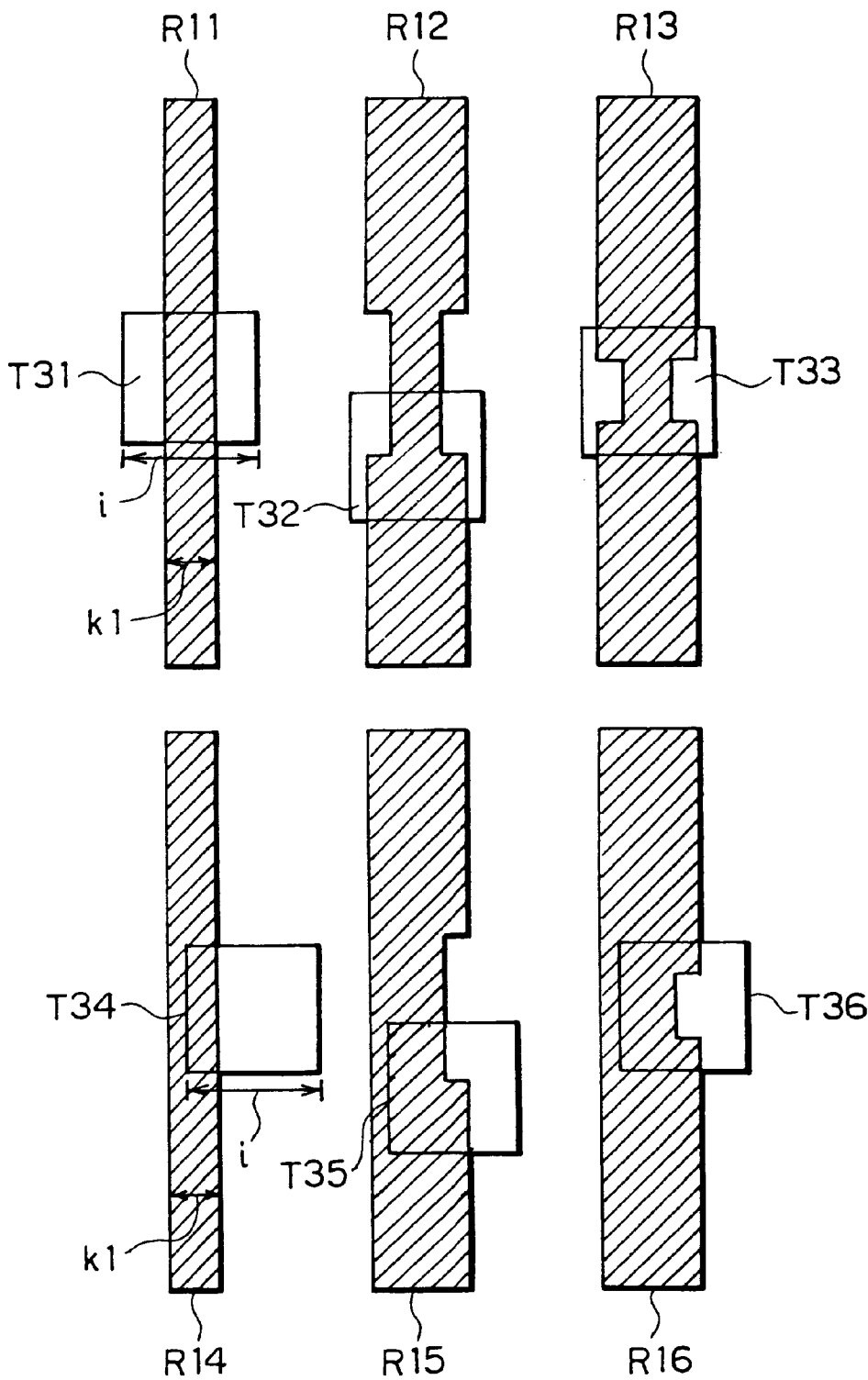
FIG. 11 is a top plan view of the first layer interconnects in the first, second and third embodiments.

Referring to FIG. 11, there are shown top plan views of the functional interconnects A1 to A9 in the first through third embodiments together with the location of the respective through-holes. The interconnect R11 in FIG. 11 corresponds to the third layer interconnects A1, A2 and A3 in the first embodiment, and the interconnect R14 corresponds to the second layer interconnects A4, A5 and A6 in the second embodiment as well as to the third layer interconnects A7, A8 and A9 in the third embodiment.

The interconnects R12 and R13 are modified from the interconnect R11. Each of the interconnects R12 and R13 has a small width portion in alignment with the through-hole T32 or T33 in the longitudinal direction of the interconnect for further increasing the contact area between the functional interconnect and the through-hole. The interconnects R15 and R16 are modified from the interconnect R14. Each of the interconnects R15 and R16 has an offset edge in alignment with the through-hole T35 or T36 in the longitudinal direction of the interconnect for further increasing the contact area for the functional interconnect and the through-hole.

In the first embodiment of FIG. 7B, the total width W2 of the underlying interconnects S1, S2 and S2 can be expressed by W2=4a+3i+2b assuming that "c" is equivalent to "b", and is smaller than the total width "W" in the conventional device. Although the total width W1 or the third layer or functional interconnects A1, A2 and A3 cannot be definitely expressed in terms of "a", "b" and "i", the total width W1 is smaller than W2 as will be understood from FIG. 7B. As a result, the first embodiment achieves reduction of the chip size.

Similarly in the second embodiment, the total widths W3 for the second layer or functional interconnects A4, A5 and A6 and W4 for the underlying interconnects S2 can be expressed as W3=3a+5i/2+2b and W4=4a+5i/2+2b, respectively, which are smaller than the total width "W" in the conventional device. Further in the third embodiment, the total widths W5 for the third layer or functional interconnects A7, A8 and A9 and W6 for the underlying interconnects S1, S2 and S2 can be expressed as W5=3a+5i/2+2b and W6=4a+5i/2+2b, respectively, which are smaller than the width "W" in the conventional device. The second and third embodiments are equivalent in their advantages of reduction of the chip size and can be selected depending on the process or device.

As described above, according to the embodiments, a buried through-hole structure used for connecting different layers of interconnects enables a reduction of the chip size of a semiconductor device without reduction of the contact size. Although the term "first layer interconnect", "second layer interconnect", etc. in the above embodiment are used to refer to the order of the conductive layers numbered from the bottom for differentiating the conductive layers, an additional conductive layer may be disposed between the first layer interconnect and the second layer interconnect, for example.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a substrate, a first layer interconnect overlying said substrate, a second layer interconnect overlying said first layer interconnect, a third layer interconnect overlying said second layer interconnect, and a through-hole filled with a conductive material, wherein said through-hole extends between and contacts said first layer interconnect and said third layer interconnect, wherein said conductive material contacts said second layer interconnect at a top surface and at least one side surface of said second layer interconnect, and wherein said first layer interconnect does not contact said second layer interconnect and said third layer interconnect, wherein said second layer interconnect has a first portion, and a second portion having a width smaller than a width of said first portion, an edge of said second portion being in alignment with a center of said through-hole as viewed from a top of said through hole in a longitudinal direction of said second layer interconnect.

2. A semiconductor device as defined in claim 1, wherein a contact area between said through-hole and said first layer interconnect is in an area adjacent to a contact area between said through-hole and said second layer interconnect as viewed from a top of said through-hole.

3. A semiconductor device as defined in claim 1, wherein said first layer interconnect contacts a portion of said through-hole that contacts said second layer interconnect on said at least one side surface of said second layer interconnect.

4. A semiconductor device as defined in claim 1, wherein an edge of said first layer interconnect extends beyond an edge of said second layer interconnect as viewed from a top of said through-hole.

5. A semiconductor device comprising a substrate, a first layer interconnect overlying said substrate, a second layer interconnect overlying said first layer interconnect, a third layer interconnect overlying said second layer interconnect, and a through-hole filled with a conductive material, wherein said through-hole extends between and contacts said first layer interconnect and said third layer interconnect, wherein said conductive material contacts said second layer interconnect at a top surface and at least one side surface of said second layer interconnect, and wherein said first layer interconnect does not contact said second layer interconnect and said third layer interconnect, wherein said second layer interconnect has a first portion, and a second portion having a width smaller than a width of said first portion, said second portion having a center in alignment with a center of said through-hole as viewed from a top of said through hole in a longitudinal direction of said second layer interconnect.

* * * * *

UNITED STATES PATENT AND TRADEMARK OFFICE
CERTIFICATE OF CORRECTION

PATENT NO.: 6,034,436
DATED: March 7, 2000
INVENTOR(S): Ritsuko IWASAKI

It is certified that error(s) appears in the above-identified patent and that said Letters Patent is hereby corrected as shown below:

Column 5, line 34 delete "53" insert --S3--
Column 6, line 13 delete both occurrences of "53" insert --S2, S2--
Column 7, line 57 delete "AG" insert --A6--

Signed and Sealed this

Third Day of April, 2001

*Attest:*

NICHOLAS P. GODICI

*Attesting Officer*      Acting Director of the United States Patent and Trademark Office